(12) United States Patent
Houbre et al.

(10) Patent No.: US 10,732,205 B2
(45) Date of Patent: Aug. 4, 2020

(54) DEVICE FOR MEASURING ELECTRIC CURRENTS IN ELECTRICAL CONDUCTORS

(71) Applicant: SCHNEIDER ELECTRIC INDUSTRIES SAS, Rueil Malmaison (FR)

(72) Inventors: Pascal Houbre, Jarrie (FR); Patrick Larcher, Echirolles (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 323 days.

(21) Appl. No.: 15/590,378

(22) Filed: May 9, 2017

(65) Prior Publication Data
US 2018/0011129 A1 Jan. 11, 2018

(30) Foreign Application Priority Data

Jul. 8, 2016 (FR) ...................................... 16 56574

(51) Int. Cl.
*G01R 15/18* (2006.01)
*G01R 15/20* (2006.01)
*G01R 19/00* (2006.01)
*G01R 35/00* (2006.01)

(52) U.S. Cl.
CPC ......... *G01R 15/181* (2013.01); *G01R 15/205* (2013.01); *G01R 19/0092* (2013.01); *G01R 35/005* (2013.01)

(58) Field of Classification Search
None
See application file for complete search history.

(56) References Cited

U.S. PATENT DOCUMENTS

| 5,617,019 A * | 4/1997 | Etter .................... G01R 15/186 324/117 R |
| 7,382,144 B2 * | 6/2008 | Lai ....................... G01R 1/0408 324/756.02 |
| 9,354,258 B2 * | 5/2016 | Ryochi .................. G01R 19/00 |
| 9,684,016 B2 * | 6/2017 | Dames ................ G01R 15/186 |

(Continued)

FOREIGN PATENT DOCUMENTS

| DE | 1 079 192 | 4/1960 |
| EP | 2 728 366 A1 | 5/2014 |

(Continued)

OTHER PUBLICATIONS

French Preliminary Search Report dated Mar. 7, 2017 in French Application 16 56574 filed on Jul. 8, 2016 (with English Translation of Categories of Cited Documents).

*Primary Examiner* — Paresh Patel
(74) *Attorney, Agent, or Firm* — Oblon, McClelland, Maier & Neustadt, L.L.P.

(57) ABSTRACT

A device for measuring electric currents includes multiple current sensors of Rogowski type, each suitable for measuring an electric current flowing through an electrical conductor, these current sensors being in adjacent pairs and each including coils for measuring the current and a central aperture for receiving the corresponding electrical conductor. Each current sensor includes two of the coils, which coils are positioned in parallel and facing one another on opposite edges of the central aperture and two ferromagnetic bars extending between ends of the coils, perpendicularly to a longitudinal axis of the coils.

14 Claims, 7 Drawing Sheets

(56) References Cited

U.S. PATENT DOCUMENTS

Figure 1:
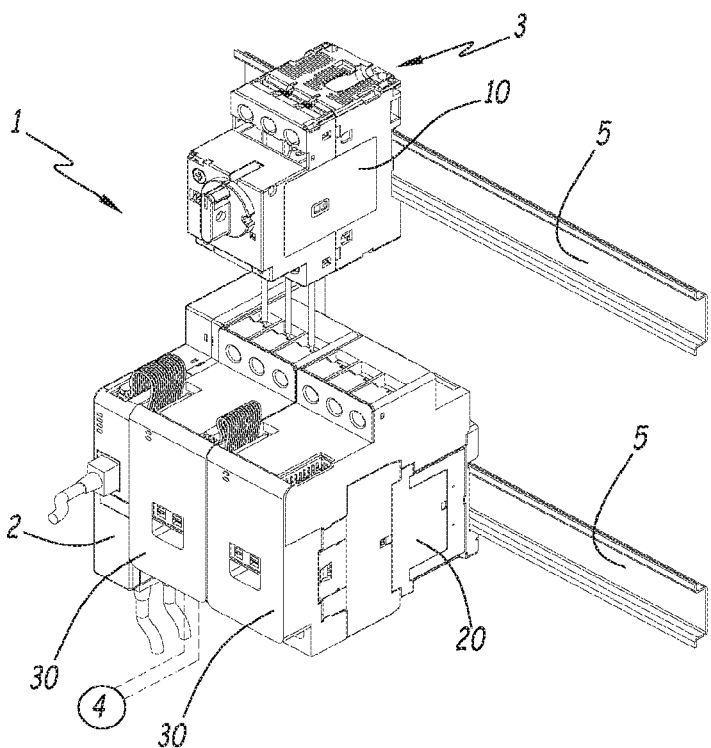

| | | | |
|---|---|---|---|
| 2010/0301836 A1* | 12/2010 | Kern | G01R 15/181 |
| | | | 324/117 R |
| 2014/0111190 A1 | 4/2014 | Ryochi et al. | |
| 2014/0125321 A1 | 5/2014 | Dames et al. | |
| 2018/0012719 A1* | 1/2018 | Houbre | H01H 71/08 |
| 2018/0014412 A1* | 1/2018 | Comtois | G05B 15/02 |

FOREIGN PATENT DOCUMENTS

| | | |
|---|---|---|
| FR | 2 920 881 A1 | 3/2009 |
| JP | 2010-256141 | 11/2010 |
| JP | 2011-89883 | 5/2011 |
| WO | WO 2013/001298 A1 | 1/2013 |
| WO | WO 2013/005351 A1 | 1/2013 |

\* cited by examiner

DEVICE FOR MEASURING ELECTRIC CURRENTS IN ELECTRICAL CONDUCTORS

The present invention relates to a device for measuring electric currents.

Electrical assemblies, intended to control the supply of electrical power to an electrical load and to ensure protection of this electrical load, are known. For example, motor starter assemblies are known to control industrial electric motors, such as asynchronous motors.

For each electrical load, such an electrical assembly typically comprises a circuit breaker and a contactor that control the power supply of this electrical load. The circuit breaker, placed upstream, protects the power supply from anomalies such as short-circuits or overcurrents. The contactor, placed downstream, makes it possible to selectively interrupt the power supply of the electrical load in response to a control signal. The interconnection module electrically connects a power output of the circuit breaker to a power input of the contactor. Such an interconnection module is described in FR 2806525 A1, for example.

When multiple electrical loads are used, it is customary to implement several motor starter assemblies interconnected in parallel, each supplying a load with electricity. These electrical assemblies may be interconnected by means of a data bus, which enables the exchange of information between each of the electrical assemblies and a central control unit. For example, this data bus makes it possible to transmit a control signal to a contactor, or to measure the status of each contactor at a given time so as to perform diagnostics remotely. An example of such a data bus is described in patent application US 2011/0119507 A1.

In such electrical assemblies, it is desirable to know the value of the electric current flowing between the circuit breaker and the contactor, in particular to indirectly detect thermal faults such as abnormal temperature rise due to overcurrent, for example.

Current sensors, capable of measuring such electric currents, are known. However, they are generally bulky and their production on an industrial scale is expensive and complex.

The invention more specifically intends to address these problems by proposing a device for measuring electric currents which is compact, has a reduced unit cost and whose industrial manufacture is simplified.

In relation thereto, the invention relates to a device for measuring electric currents in an electrical circuit, this device comprising multiple Rogowski type current sensors, each adapted to measure an electric current flowing through an electrical conductor, these current sensors being in adjacent pairs and each having:
coils adapted to be electrically connected together to form a current measuring circuit,
a central opening for receiving the corresponding electrical conductor, and coils being arranged on the periphery of the central opening,
the measuring device having a plurality of ferromagnetic bars, each current sensor having two of said coils, arranged parallel and facing one another on opposite edges of the central opening and two of said ferromagnetic bars, extending between the ends of the coils, perpendicularly to a longitudinal axis of the coils.

Owing to the invention, a reliable means is available to measure the currents flowing in electrical conductors. The modular construction of the measuring device makes it easier and less expensive to manufacture on an industrial scale.

According to advantageous but non-mandatory aspects of the invention, the interconnection module may include one or more of the following characteristics, considered in all technically allowable combinations, wherein:
Each current sensor has a ferromagnetic bar in common with the immediately adjacent current sensor.
The device comprises first and second armatures arranged parallel to each other and common to all the current sensors of the device, the two coils of each current sensor being arranged on the first and second armatures, respectively.
Each of the first and second armatures have a rectilinear part, the coils being arranged on these first and second armatures by winding about this rectilinear part.
Each of the first and second armatures comprise housings adapted to receive one end of one of the ferromagnetic bars.
The first and second armatures are identical and each have fastening elements adapted to join the first and second armatures together to form the measuring device.
The first and second armatures each comprise a main part, rectilinear in shape, and secondary parts that project from the main part perpendicularly to the main part, and coils being wound onto the first and second armatures at the level of the secondary parts.
The main part of each of the first and second armatures comprises a recess which receives one of the ferromagnetic bars, this recess extending along the length of the main part.

According to another aspect, the invention relates to a measuring device as described above, characterized in that the ferromagnetic bars are made of an iron alloy, such as soft iron, NiFe or FeSi.

According to another aspect, the invention relates to an assembly comprising an electrical device, electrically powered by electrical conductors and a measuring device, adapted to measure an electric current flowing through each of the electrical conductors. According to the invention, the measuring device is as described above, each of the electrical conductors being received inside the central receiving area of the corresponding current sensor.

Figure 2:
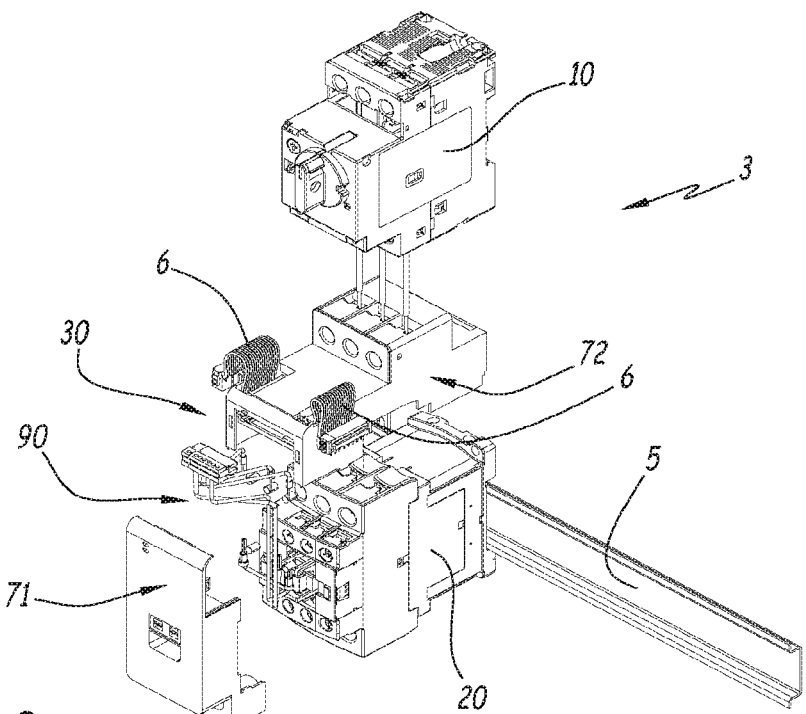
Figure 3:
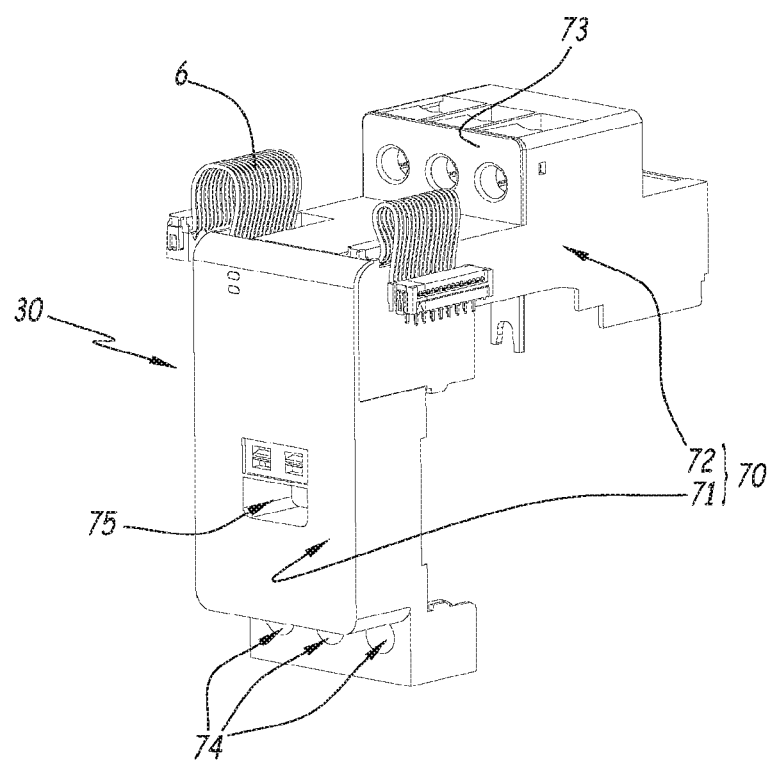
Figure 4:
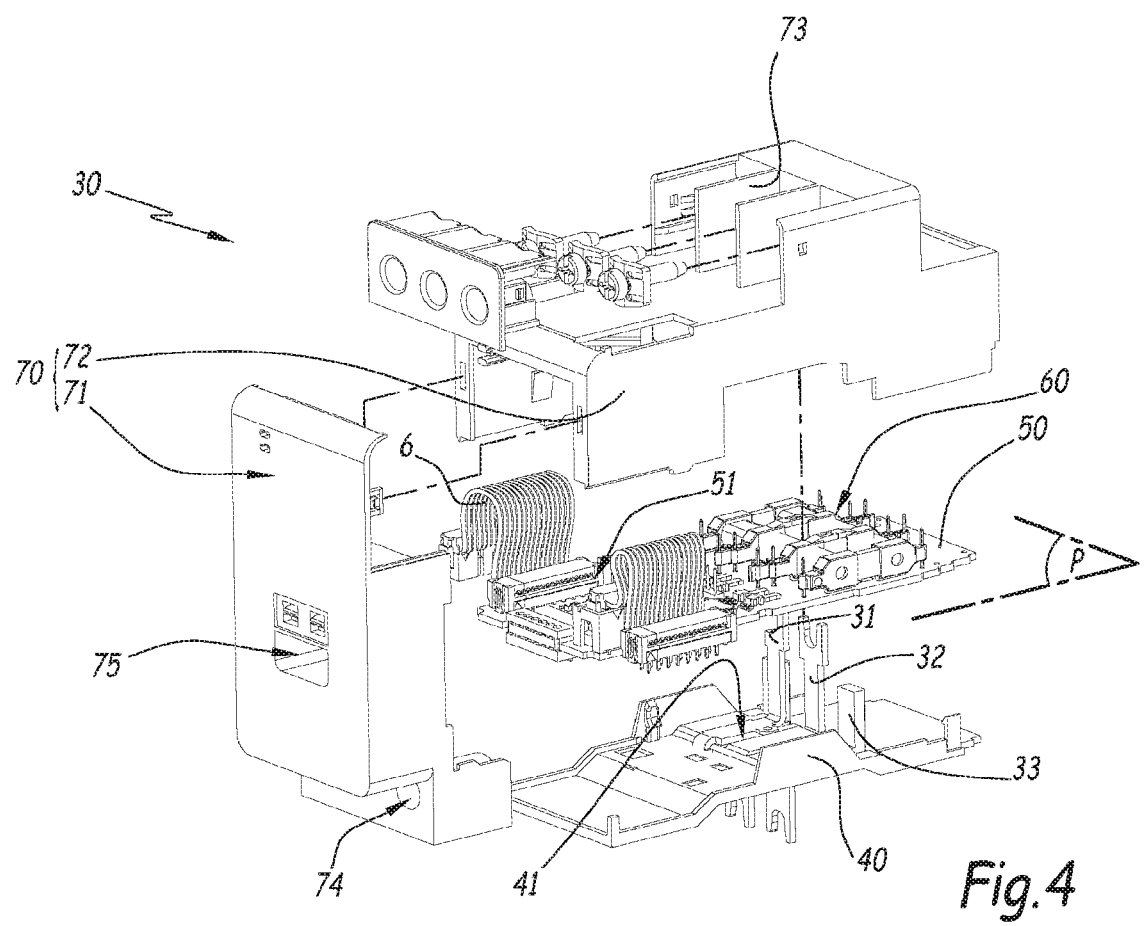
Figure 5:
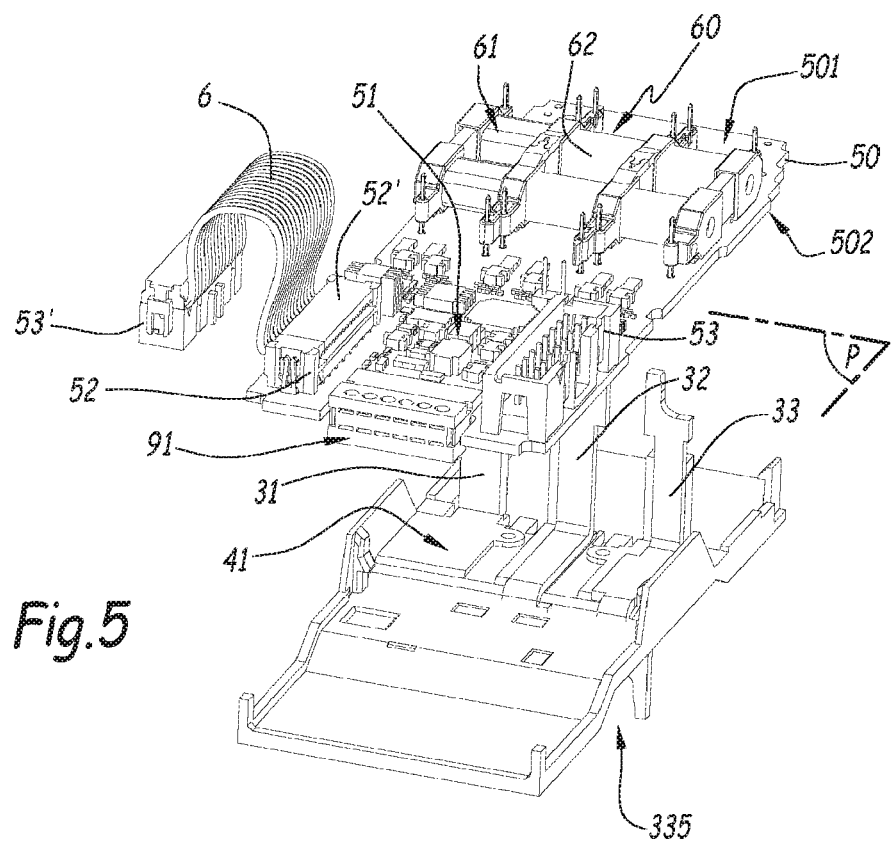
Figure 6:
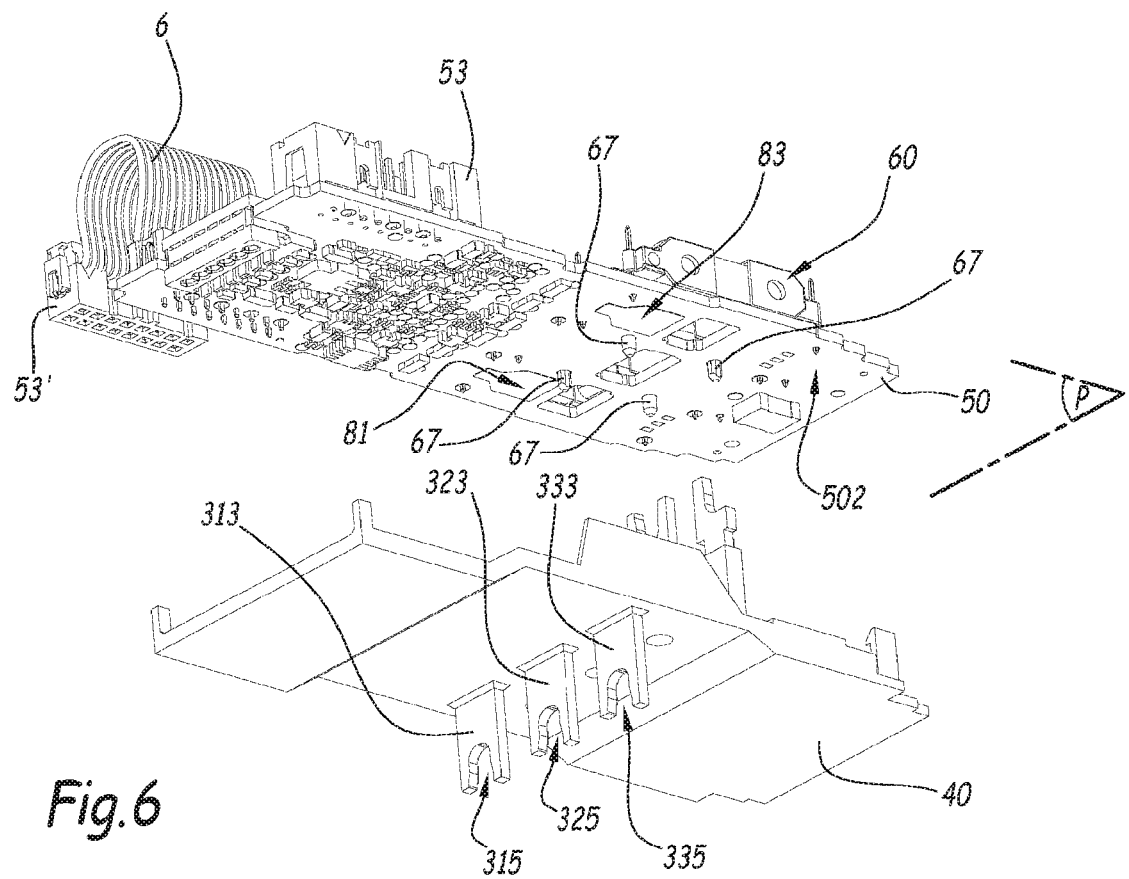
Figure 7:
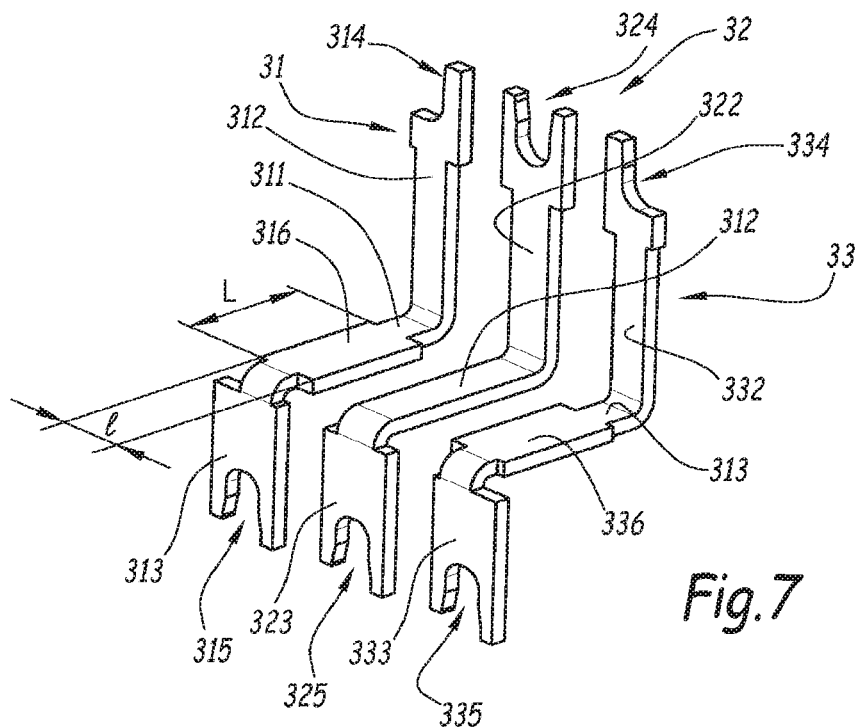
Figure 8:
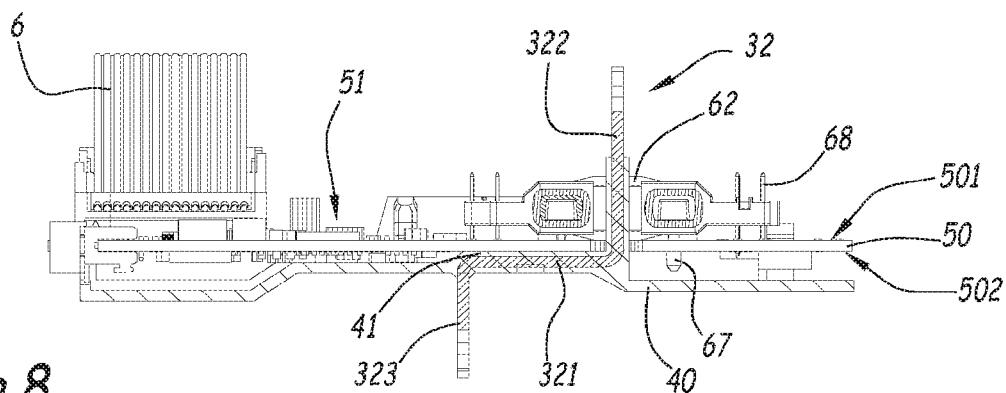
Figure 9:
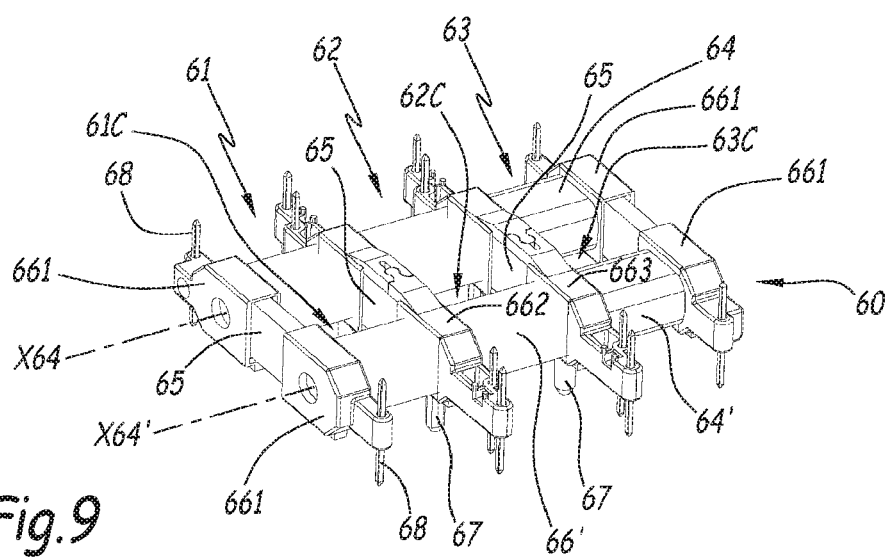
Figure 10:
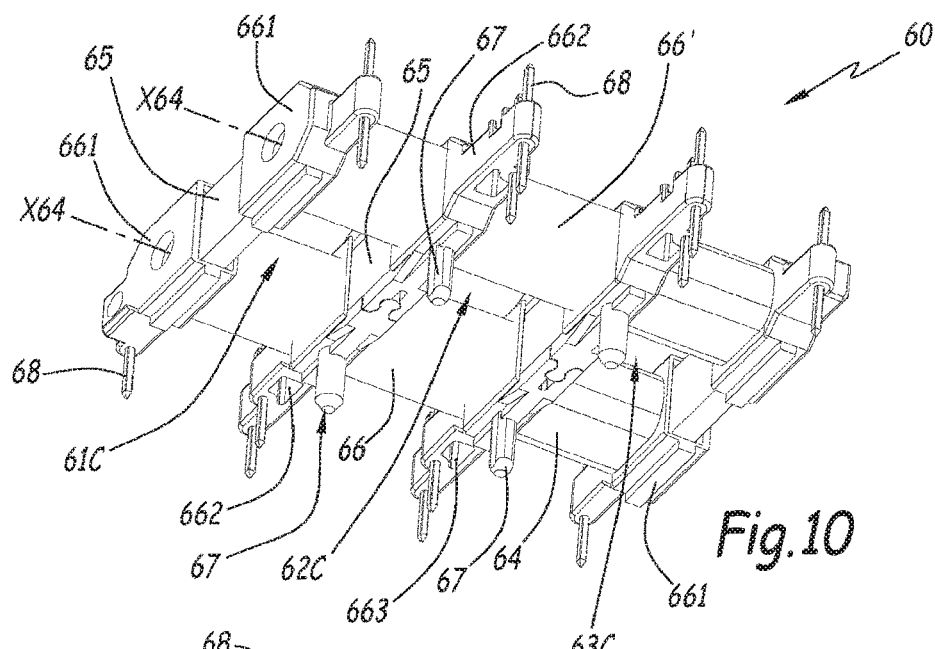
Figure 11:
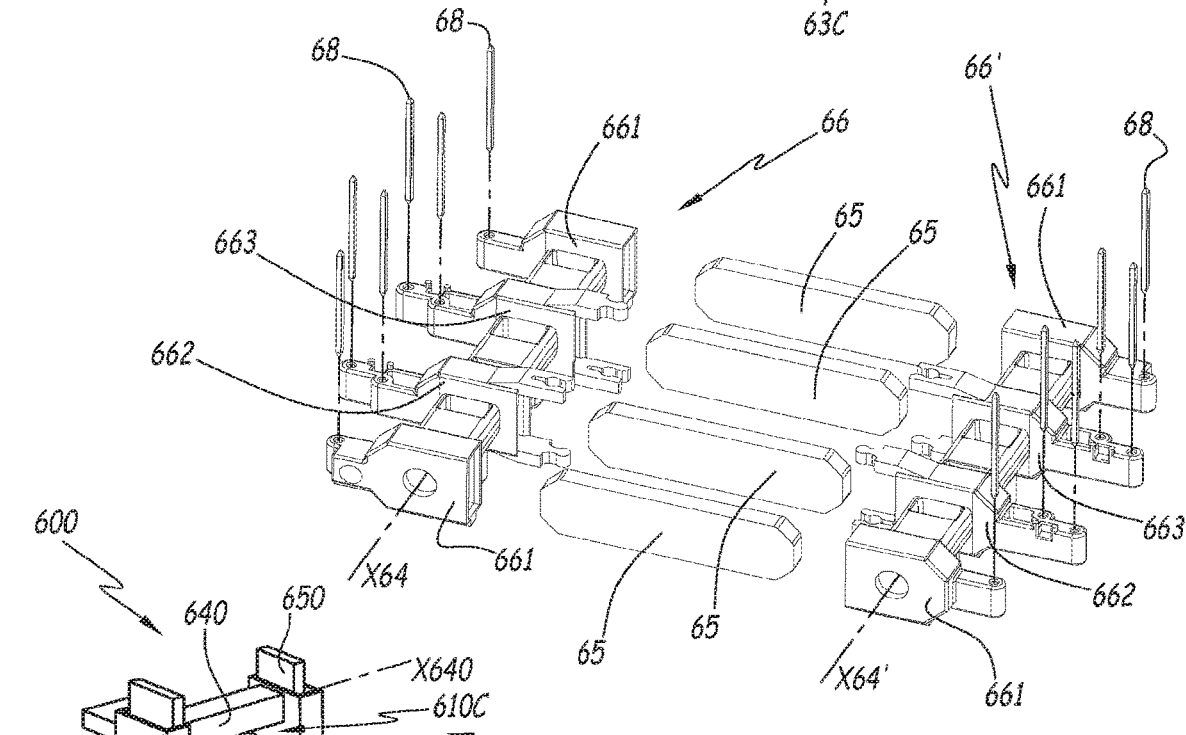
Figure 12:
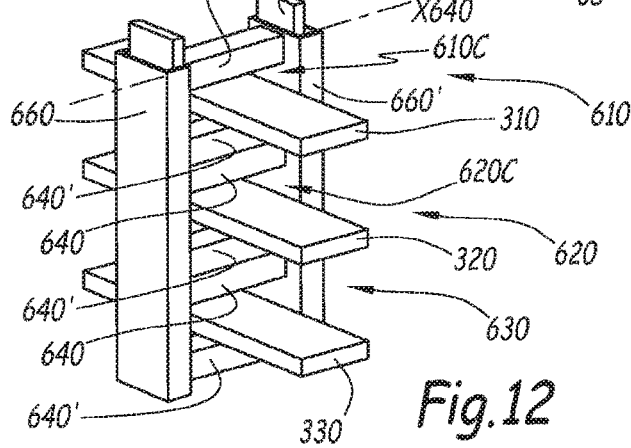
Figure 13:
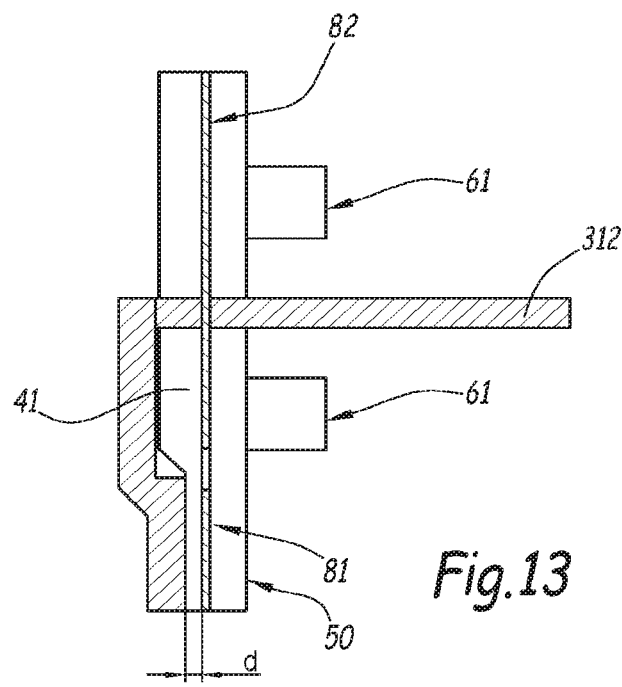
Figure 14:
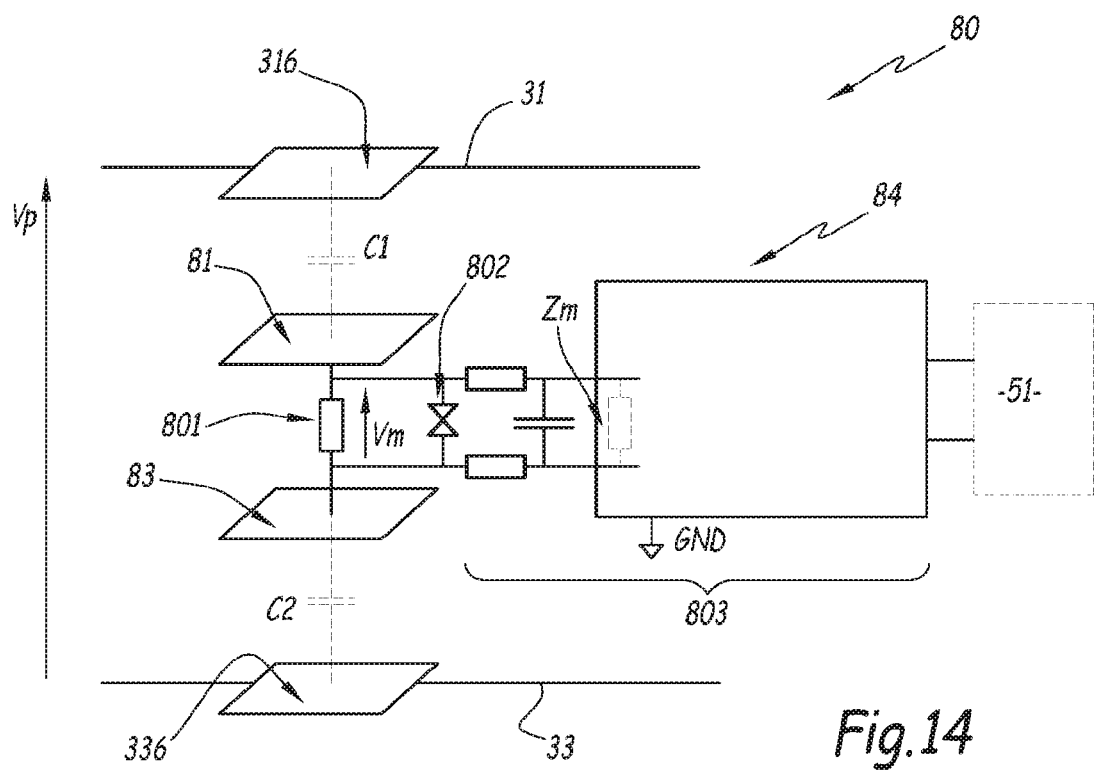

The invention will be better understood and other advantages thereof will become more apparent upon reading the following description of an embodiment of an interconnection module, given solely for example and with reference to the accompanying drawings, wherein:

FIG. 1 is a schematic representation of an electrical installation having an electrical assembly provided with an interconnection module according to the invention;

FIG. 2 schematically represents an exploded perspective view of an electrical assembly of FIG. 1 having a circuit breaker, a contactor and an interconnection module according to the invention;

FIGS. 3 and 4 schematically represent the interconnection module of FIGS. 1 and 2 in an assembled configuration and in an exploded view, respectively;

FIGS. 5 and 6 schematically represent a top and bottom view, respectively, of an electronic board of the interconnection module of FIG. 2;

FIG. 7 schematically represents a close-up view of the electrical power conductors of the interconnection module of FIG. 2;

FIG. 8 is a schematic longitudinal cross-sectional view of the electronic board of FIGS. 5 and 6;

FIGS. 9 and 10 schematically represent perspective views of a device for measuring current flowing through the electrical power conductors of FIG. 7;

FIG. 11 schematically represents an exploded view of the current measuring device of FIGS. 9 and 10;

FIG. 12 schematically represents another embodiment of the current measuring device of FIGS. 8 to 10;

FIG. 13 schematically represents a cross-sectional view of an electric voltage sensor equipping the interconnection module of FIG. 2;

FIG. 14 schematically represents a wiring diagram of the voltage sensor of FIG. 13.

Figure 15:
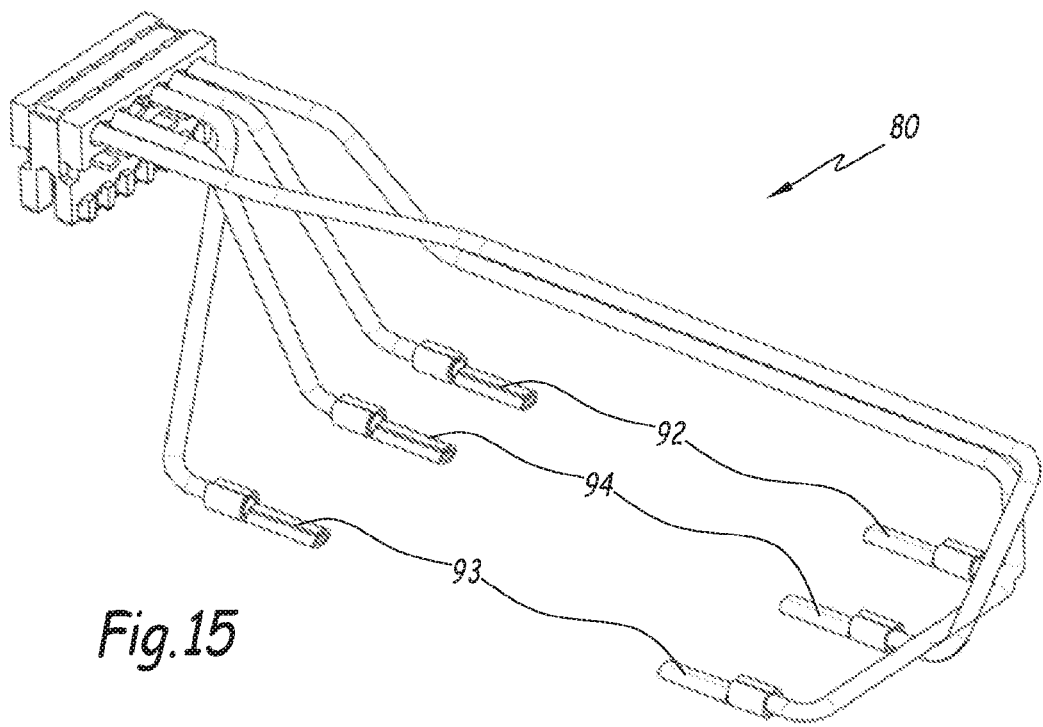
Figure 16:
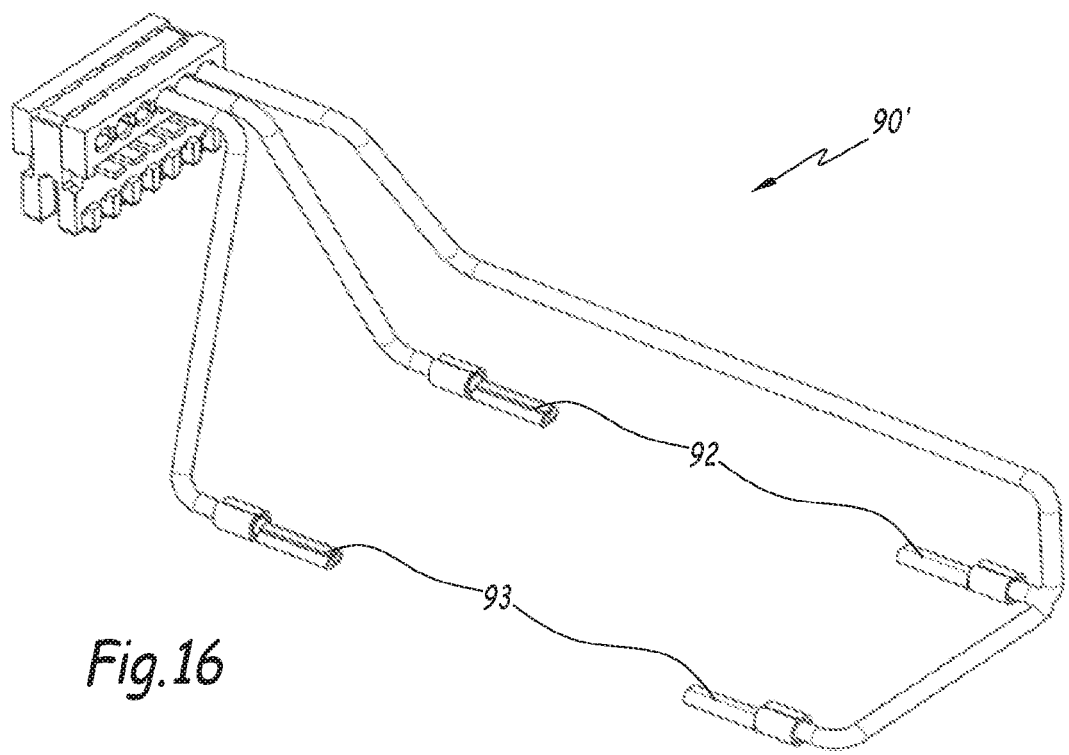

FIGS. 15 and 16 schematically represent two embodiments of a data link between the interconnection module and the contactor of FIG. 2.

FIG. 1 represents an electrical control installation 1 of a set of electrical loads. The electrical installation 1 comprises a central control unit 2, also designated as the head-end, and multiple electrical assemblies 3, each adapted to control the supply of power to an electrical load 4. The central control unit 2 and the electrical assemblies 3 are secured along one of the multiple mounting rails 5 of the type known as the "DIN rail", for example. Here, these electrical assemblies 3 are identical to each other.

In this example, the electrical loads 4 are industrial electric motors, such as asynchronous motors.

To simplify FIG. 1, only two electrical assemblies 3 are illustrated. Alternatively, the assembly 1 can include a different number of such electrical assemblies 3. Similarly, only a single motor 4 is illustrated.

Each of the electrical assemblies 3 is adapted to control the power supply to an electrical load 4. More precisely, each of the electrical assemblies 3 is placed between a source of electrical energy, not shown, and one of the electrical loads 4. The electrical assemblies 3 are well suited to control the power supply of this electrical load 4, for example to selectively enable or disable the power supply of the corresponding electrical load 4. In this example, the source of electrical energy supplies an electric power supply current, here AC and three-phase.

As shown in FIG. 2, each of the electrical assemblies 3 comprises a circuit breaker 10, a contactor 20 and an interconnection module 30 between the circuit breaker 10 and the contactor 20.

The circuit breaker 10 is adapted to interrupt the flow of electric current from the power source in case of an anomaly or a safety defect. This defect is, for example, an overcurrent or a short circuit.

Here, the circuit breaker 10 is a multipolar circuit breaker, provided with a plurality of electrical poles, each associated with an electrical phase of the electric power supply current. For example, the circuit breaker 10 comprises, for each pole, a current input and output connected by separable electrical contacts inside the circuit breaker 10. These electrical contacts are switchable between open or closed states, so as to interrupt or authorise the passage of current between the current input or outlet, respectively. This switching takes place automatically, by an electrical fault detection circuit, in case of an anomaly such as an overcurrent or a short-circuit.

The current inputs of the circuit breaker 10 are connected to the source of electrical energy.

The contactor 20 is adapted to interrupt or, alternately, allow the flow of electric current from the output of the circuit breaker 10, to the corresponding electrical load 4, based on the control signal issued by the central control unit 2.

Here, the contactor 20 is a multipolar contactor, provided with a plurality of electrical poles, each associated with an electrical phase of the electric power supply current. For example, the circuit breaker 20 comprises, for each pole, a current input and output connected together by separable electrical contacts inside the circuit breaker 20. These electrical contacts are selectively movable between open and closed positions, wherein they inhibit or authorise the flow of electric current, respectively, between the current input and output of the contactor 20. This movement is achieved by means of an actuator inside the contactor 20, in response to the control signal. This actuator comprises an electromagnet, for example.

The contactor 20 also comprises sensors for measuring the status of the separable electrical contacts. In particular, these sensors are configured to provide a first status signal indicating that the contacts are in a normally closed state, referred to as the "Normally Closed" (NC) status signal. These sensors are configured to provide a second status signal indicating that the contacts are in a normally open state, referred to as the "Normally Open" (NO) status signal. These status signals are used to diagnose the status of the contactor 20.

The current outputs of the contactor 20 are electrically connected to the corresponding electrical load 4 to supply this electrical load 4 with the electric power supply current.

The central control unit 2 is notably configured to selectively control each of the contactors 20 and to collect information on the status of each of the contactors 20 provided by each of these contactors 20. In relation thereto, the installation 1 comprises a data bus that connects the various electrical assemblies 3 to the central control unit 2. Here, this data bus is achieved by connecting the electrical assemblies 3 in series, in twos, by means of ribbon cable 6, as explained in more detail in what follows.

The interconnection module 30 electrically connects the current outputs of the circuit breaker 10 to the corresponding current inputs of the contactor 20. In addition, the interconnection module 30 is adapted to measure physical values representative of the electric current that flows from the circuit breaker 10 to the contactor 20, as explained in more detail in the following. Here, the module 30 is intended to be placed above the contactor 20 and below the circuit breaker 10.

FIGS. 3 to 6 show an example of the interconnection module 30 in greater detail. The interconnection module 30 notably comprises electrical power conductors 31, 32 and 33, a support plate 40, an electronic board 50 and a casing 70. The interconnection module 30 further comprises a device for measuring the current 60, a voltage sensor 80 and a data link 90, the respective roles of which are described in more detail in what follows.

The electrical power conductors 31, 32 and 33 are each adapted to convey an electric current associated with an electric phase of the power supply current. Each of the power conductors 31, 32, 33 electrically connects a current output of a pole of the circuit breaker 10 to a corresponding current input of the contactor 20 corresponding to this same pole.

The term "electrical power conductor", refers to an electrical conductor adapted to convey electric current greater than or equal to 10 amps, preferably greater than or equal to 100 amps. Comparatively, the intensity of the electric currents flowing in the ribbon cables 6 of the data bus is at least ten times less or one hundred times less than the intensities of the electrical power supply currents.

Here, the electrical conductors 31, 32 and 33 are made of an electrically conductive material, such as copper.

As shown in FIG. 7, each of the electrical conductors 31, 32, 33 comprises a central plane part and upper and lower parts. The central part has the shape of a plane plate. The upper and lower parts extend perpendicularly with respect to the plane plate, from the opposite ends of the central part. These upper and lower parts extend on either side of the central part, parallel to each other.

The central parts of the electrical conductors 31, 32 and 33 are noted 311, 321 and 331, respectively. The upper parts of the electrical conductors 31, 32, 33 are noted 312, 322 and 332 and the lower parts of the electrical conductors 31, 32 and 33 are noted 313, 323 and 333.

In a mounted configuration of the module 30, the central parts 311, 321 and 331 extend parallel to a geometric plane P.

Each upper part 312, 322 and 332 is terminated by a connection area 314, 324 and 334 provided with a screw hole adapted to receive a connection screw, so as to form an electrical connection with another electrical connector to connect this power conductor to a current output of the circuit breaker 10.

Similarly, each lower part 313, 323 and 333 is terminated by a connection area equipped with a screw hole 315, 325 and 335 adapted to receive a connection screw, so as to form an electrical connection with another electrical connector to connect this power conductor to a current output of the contactor 20.

In a mounted configuration of the module 30, the electrical conductors 31, 32 and 33 are aligned with one another so that their upper parts 312, 322 and 332 are parallel with each other and that their lower parts 313, 323 and 333 are parallel with each other. The electrical conductor 32 is arranged between the electrical conductors 31 and 33.

In this example, the power conductors 31, 32 and 33 have a similar shape, such that only their differences are described in detail in what follows.

Advantageously, the electrical conductors 31, 32 and 33 differ by the specific shape of the connection area 314, 324 and 334 and/or connection areas 315, 325 and 335. This facilitates the visual identification of the various poles and provides a foolproofing function that prevents an operator, when assembling the interconnection module 30, from swapping the position of the electrical conductors 31, 32 and 33.

The electrical conductors 31, 32 and 33 also differ from each other by the size of their central part 311, 321 and 331.

In particular, the electrical conductors 31 and 33 are provided with an extra width on their central part, 311 and 331, respectively. This extra width takes the form of a plate, designated 316 and 336, respectively, integrated within the central part, 311 and 331, respectively.

Here, the plates 316 and 336 are identical and have a rectangular shape, width "L" and length "l". Here, for example, the width L is equal to 12 mm and the length l is equal to 6 mm. The width L and the length l are measured parallel to the geometric plane P in the mounted configuration of the module 30.

The support plate 40 has an essentially planar shape extending along the plane P. This support plate 40 is made of a rigid and electrically insulating material, plastic material for example, such as polyamide 6-6.

The support plate 40 comprises an overmoulded area 41 on the central parts 311, 321 and 331 of the electrical conductors 31, 32 and 33, on either side of the opposite faces of these central parts 311, 321 and 331. These overmoulded areas 41 make it possible to partially electrically insulate the electrical conductors 31, 32 and 33 in relation to the electronic board 50. The dimensions of the overmoulded areas 41 correspond to the width of the central part 311, 321 and 331, notably to take into account the plates 316 and 336 arranged at the central parts 311 and 331.

The electrical conductors 31, 32 and 33 are thus partially integrated within the support plate 40. The upper parts 312, 322 and 332 and the lower parts 313, 323 and 333 protrude on either side of the support plate 40, as shown in FIG. 8.

Thus, owing to the support plate 40 and the overmoulded areas 41, electrical insulation is ensured between the electrical conductors 31, 32 and 33 and the electronic board 50.

In this example, the module 30 is intended to be mechanically fastened to the contactor 20. The module 30 comprises, for example, fastening devices, not shown, to integrally attach it to the casing of the contactor 20.

In a mounted configuration, as shown in FIG. 2, the contactor 20 and the interconnection module 30 thus form an electrical device. In relation thereto, the shape of the casing 70 of the module 30 is complementary to that of the contactor 20.

As shown in FIG. 3, the casing 70 particularly features a shape comprising two main blocks joined together and extending perpendicularly in an "L" shape. The casing 70 is, for example, made of a moulded plastic.

In a mounted configuration of the module 30 on the contactor 20, one of the blocks, said front block 71, is arranged in contact with a front face of the contactor 20. The other block, said upper block 72, is arranged on an upper face of the contactor 20. The electrical conductors 31, 32 and 33, of the plate 40 and the electronic board 50 are housed inside the upper block 72.

The casing 70 comprises a body defining a hollow housing and a cover which covers and closes the body. The assembly of this body and this cover allows the two blocks 71 and 72 of housing 70 to be obtained.

Alternatively, the shape of the casing 70 can be different.

In an assembled configuration of the module 30, the connection areas 315, 325 and 335 of the upper parts 312, 322 and 332 extend outside the upper block, in this case through the cover.

Here, the module 30 comprises a terminal block 73 to facilitate the connection of the connection areas 315, 325 and 335 to the corresponding current outputs of the circuit breaker 10. This terminal block 73 is arranged on an upper face of the block 72. Here, the terminal block 73 is integrated within the casing 70.

When the terminal block 73 is used, the electrical connection between the link module 30 and the circuit breaker 10 is made by means of dedicated electric cables, the respective terminal ends of which are connected to the power conductors 31, 32 and 33, respectively, by screwing in the terminal block 73. The circuit breaker 10 can thus be secured a distance away from the link module 30, without having to always be in contact with the casing 70. This allows the module 30 to be adapted to a wide variety of situations, notably according to the environment of the electrical installation 1.

Alternatively, the terminal block 73 can be removably mounted with respect to the casing 70.

According to yet another variant, the terminal block 73 can be omitted. When the terminal block 73 is omitted, the connection areas 315, 325 and 335 of the electrical conductors 31, 32, 33 are directly accessible from outside the casing 70. In this manner, the circuit breaker 10 can be attached to the link module 30 by simple insertion. The circuit breaker 10 is thus in contact with the module 30. In this case, the module 30 thus mechanically connects the circuit breaker 10 to the contactor 20.

Advantageously, the front part 71 is provided with through-holes 74. These holes 74 are arranged so that they open facing the corresponding holes in the contactor 20 when the module 30 is mounted on the contactor 20. These holes allow a user to insert a screwdriver through the module 30, so as to access the clamping screws of the contactor 20. These clamping screws are used to connect electric wires to the current outputs of the contactor 20 in order to connect it to the corresponding electrical load 4. In doing this, the module 30 can be used on existing contactors 20, without having to modify the geometry or the architecture of these contactors 20.

Optionally, the front part 71 is provided with a through-window 75. The window 75 is arranged so as to open in front of a pre-existing window of the contactor 20 when the module 30 is mounted on the contactor 20. The contactor 20 comprises a window, not shown here, which indicates the position of the separable electrical contacts and which can be used by a user to mechanically verify the position of the separable electrical contacts. Here again, the module 30 can be mounted on existing contactors 20, without having to modify the geometry or the architecture of these contactors 20.

Alternatively, the holes 74 and/or the window 75 are omitted.

FIGS. 5, 6 and 8 represent the electronic board 50 in greater detail. The electronic board is provided with an electronic circuit notably including an electronic unit 51, the role and function of which will be described in what follows. For example, the electronic unit 51 is a programmable microcontroller.

Here, the electronic board 50 comprises a printed circuit produced on a rigid insulating support by means of electrically conductive paths. The insulating support is, for example, a plate made of "Printed Circuit Board" PCB-A type epoxy resin.

The upper face of the electronic board 50 is noted "501" and the lower face of the electronic board 50, opposite face 501, is noted "502".

In this example, the electronic components belonging to the electronic circuit of the electronic board 50 are arranged on the upper face 501. The electrically conductive paths forming the printed circuits are arranged on the opposite lower face 502.

In an assembled configuration of the module 30, the electronic board 50 is arranged parallel to the support plate 40 and therefore parallel to the geometric plane P. Here, the electronic board 50 is at least partially in contact with the plate 40.

The electronic board 50 is provided with several through-holes, so-called passage openings, allowing the upper parts 312, 322 and 332 of the electrical conductors 31, 32 and 33 to pass through them. In this manner, when the module 30 is in an assembled configuration, each of the electrical conductors 31, 32 and 33 passes through the electronic board 50. The upper parts of the 312, 322 and 332 extend perpendicularly to this electronic board 50.

Alternatively, the electronic board 50 is arranged under the central parts 311, 321 and 331, so as to be traversed by the lower parts 313, 323 and 333 of the electrical conductors 31, 32 and 33. In this case, the faces of 501 and 502 are swapped.

The electronic unit 51 comprises an interface connection adapted to be connected with the data bus. For this purpose, the electronic board 50 comprises connectors 52 and 53 fixed to the upper face 501 and connected to the electrically conductive paths of the integrated circuit. These connectors 52 and 53 are configured to be connected to corresponding connectors, designated 52' and 53', respectively, of the ribbon cable 6. For example, the connectors 52' and 53' are arranged at opposite ends of a flexible electric ribbon cable. Here, the connectors 52 and 53 are of different type and notably of different size, so as to avoid unwanted switching of the ribbon cables 6 forming the data bus. In this example, the connector 53 is accessible from the outside of the casing 70 of the module 30.

The data bus allows data to be exchanged between the module 30 and outside the assembly 3. This data is, for example, control signals from the actuator of the contactor 20 or signals indicating the state of the contactor 20. The data bus also conveys an electrical power supply from the electronic board 50, for example by means of an electric voltage less than or equal to 24 VDC.

In this example, in a mounted configuration of the module 30, a copy of the ribbon cable 6 is connected to the electronic board 50 via the connector 52', the latter being received inside the corresponding connector 52. This connection is, for example, made during the manufacture of the module 30, before the casing 70 is closed, so that the end of the ribbon cable 6, equipped with the connector 53', extends to the outside of the casing 70. The connector 53' can then be electrically connected to a corresponding connector 53 of the module 30 of another assembly 3 of the installation 1 or to the central control unit 2.

The module 30 further comprises a current measuring device 60, shown in more detail in FIGS. 9, 10 and 11.

The measuring device 60 is configured to measure the values of the electric currents that circulate in the electrical conductors 31, 32 and 33. For this purpose, the measuring device 60 comprises multiple Rogowski type current sensors 61, 62, 63, each adapted to measure the current values of the electric current flowing through one of electrical conductors 31, 32 and 33, respectively. Such Rogowski type sensors make it possible to determine the value of the current flowing in an electrical conductor by measuring the magnetic flux induced about this electrical conductor by the flow of the electric current therein.

Here, the current sensors 61, 62 and 63 are adjacent in pairs and aligned rectilinearly. Each of the current sensors 61, 62 and 63 comprise coils 64 and 64', or solenoids, which are identical here, and a central receiving area 61C, 62C, 63C of the corresponding electrical conductor 31, 32 and 33. Here, the measuring device 60 is fixed to the upper face 501 of the electronic board 50.

In an assembled configuration of the link module 30, each of the electrical conductors 31, 32 and 33 is received inside the central opening 61C, 62C and 63C of the current sensors 61, 62 and 63, respectively. The measuring device 60 allows real-time measurement of the value of the electric currents flowing in the electrical conductors 31, 32, 33 between the circuit breaker 10 and the contactor 20.

The coils 64 and 64' are adapted to be electrically connected together to form a current measuring circuit in the corresponding conductor. The coils 64 and 64' are rectilinear and extend along the longitudinal axes, designated X64 and X64', respectively. Here, each coil 64, 64' comprises a solenoid formed by winding a conductor wire with, for example, 520 turns spread over 5 layers, with an inductance value of 0.7 mH for each of the coils 64, 64'.

The measuring device 60 further comprises several ferromagnetic bars 65, here identical to each other, and first and second armatures, or carcasses, designated 66 and 66', respectively, on which the coils 64 and 64' are arranged. In this example, the armatures 66 and 66' are arranged parallel to one another and are common to all the current sensors 61, 62 and 63 of the measuring device 60.

The ferromagnetic bars 65 make it possible to channel the magnetic flux generated when an electric current passes through the corresponding electrical conductor 31, 32, 33, so as to facilitate its measurement by the coils 64 and 64'. For example, the ferromagnetic bars 65 are made of an iron alloy, such as soft iron or iron-nickel NiFe alloy or an FeSi alloy. Here, there are four ferromagnetic bars 65.

Thus, when an electric current flows through the electrical conductors 31, 32 and 33, a magnetic flux appears that generates a difference in electrical potential at the terminals of the coils 64 and 64' of the corresponding current sensors 61, 62 and 63. These differences in electrical potential are measured by the electronic unit 51, for example by means of an analogue-digital converter, not shown. The electronic unit 51 automatically deduces the value of the corresponding amperage for each of the electrical conductors 31, 32 and 33, for example from a predetermined formula.

Here, the current sensors 61, 62 and 63 are identical, such that only the current sensor 61 is described in detail in what follows, insofar as the description provided is transferable to them.

More precisely, the current sensor 61 comprises two of the coils 64 and 64', arranged parallel and opposite each other on opposite edges of the central area 61C. The current sensor 61 further comprises two ferromagnetic bars 65. These ferromagnetic bars 65 are arranged in the same plane with the coils 64 and 64' and extend between the ends of the coils 64 and 64' perpendicular to the axes X64 and X64'.

Each of the current sensors 61, 62, 63 has a ferromagnetic bar 65 which is in common with the immediately adjacent current sensor. In this case, here, the current sensor 61 features a rod 65 in common with the current sensor 62. Furthermore, the current sensor 63 features a rod 65 in common with the current sensor 62.

Thus, in this example, the measuring device 60 comprises three coils 64 and three coils 64'. The measuring device 60 also comprises four ferromagnetic bars 65 that extend between the coils 64 and the coils 64'. The coils 64, 64' and the ferromagnetic bars 65 are arranged in a same plane parallel to the geometric plane P so as to form, for this current sensor 61, a polygonal contour, shown here with a square shape. This polygonal contour defines the corresponding central opening 61C.

In a preferred embodiment of the invention, both the armatures 66 and 66' are rectilinear. The coils 64 and 64' are arranged on these armatures 66 and 66' by winding. Thus, the longitudinal axes of the coils X64 and X64' coincide with a longitudinal axis of the armatures 66 and 66', respectively. The coil that is wound about the reinforcement 66 bears the reference 64, while the coil that is wound about the armature 66' bears the reference 64'.

In this example, both the armatures 66 and 66' comprise housings, or alveoli configured to receive one end of one of the ferromagnetic bars 65.

Here, there are four housings. The housings located at the ends of the armatures 66 and 66' bear the reference 661. The housings located between the housings 661 bear the references 661, 662 and 663. Alternatively, the number of such housings can be different, preferably at least equal to two.

In this example, the ferromagnetic bars are in the shape of a rectangular parallelepiped plate. To illustrate this, each ferromagnetic bar 65 is fifteen millimetres long, five millimetres wide and two millimetres thick. The shape of the housings 661 is complementary to that of the ends of the bar 65. Here, the housings 661, 662 and 663 are integrated within the armatures 66 and 66'. As such, these housings 661, 662 and 663 allow the winding areas of the coils 64 and 64' to be defined.

Advantageously, the armatures 66 and 66' are provided with fastening elements 664 and 665, intended to integrally connect this armature to the opposite armature to form the measuring device 60. These fastening elements 664 and 665 further allow the ferromagnetic bars 65 to be held in position. In this example, the fastening elements 664 and 665 are supported by the housings 662 and 663.

Here, the fastening elements 664 and 665 are connectable elements of complementarily shape, for example of tongue-groove type, allowing snap-fastening. Alternatively, they can be made differently, for example by means of a hook system.

To illustrate this, the intermediate housing 662 of the armature 66 bears a male type fastening element 664. The housing 662 of the armature 66', located opposite the housing 662 in an assembled configuration of the measuring device 60, bears a female type fastening element 665.

The armatures 66 and 66' bear fastening studs 67 projecting from the measuring device 60, perpendicular to the geometric plane P when the measuring device 60 is in an assembled configuration on the electronic board 50.

As shown in FIG. 9, the fastening studs 67 are arranged on the same side of the measuring device 60, specifically on the side of the measuring device 60 that is intended to come into contact with the electronic board 50. These fastening studs 67 are intended to be received in corresponding holes, made through the electronic board 50. This allows the measuring device 60 to be secured to the electronic board 50 and to facilitate the alignment of the measuring device 60 so that the central openings 61C, 62C and 63C are located opposite the passage openings made on the electronic board 50 for the electrical conductors 31, 32 and 33 to pass through.

The measuring device 60 further comprises connection pins 68 of the coils, here provided on the armatures 66 and 66', on the distal ends of the housings 661, 662 and 663. These connection pins 68 are designed to electrically connect the opposed ends of each of the coils 64 and 64' to the control unit 51, by means of electrically conductive paths of the electronic board 50, with which they are intended to be in direct electrical contact. More precisely, the ends of the wire forming the coil of each of the coils 64 and 64' are then wound about this pin 68 so as to ensure an electrical connection. Each connection pin 68 is in the form of a straight rod made of an electrically conductive material, one end of which is received inside the electronic board 50, so as to ensure an electrical connection with an electrical path of the electronic board 50.

The modular design of the measuring device 60 simplifies its industrial production and reduces its cost per unit. Here, the armatures 66 and 66' are identical to each other and differ only by their relative position within the measuring device 60. The measuring device 60 is formed by assembling the armatures 66 and 66' with one another in a head to tail manner. The measuring device 60 can thus be manufactured with a reduced number of parts.

In addition, by using ferromagnetic bars 65, the manufacturing cost of the measuring device 60 is reduced in relation to currently existing Rogowski type measuring devices wherein the entire periphery of each central opening is equipped with a solenoid winding or coil. In the present case, the number of coils 64, 64' required for each of the current sensors 61, 62 and 63 is equal to two, which is less than in known Rogowski type current sensors where at least four such coils are required.

The measuring device 60 can be manufactured industrially in the following manner.

In a first step, an armature 66 or 66' is acquired. This armature 66 or 66' is first provided with connection pins 68.

Then, in a second step, coils 64 are formed by winding on the winding areas of the armature 66, using an automatic winding machine, for example. First, the conductive wire is wound about one of the connection pins 68, with one turn, then wound repeatedly about a first winding area of the armature 66 to form a first coil 64. Then, this wire is wound about another connection pin of the armature 66. The wire is then cut, and then the operation is repeated in the same manner for each of the winding areas of the armature 66. The coils are thus formed in a simplified manner about the armature 66.

Then, the measuring device 60 is assembled in a third step. To this end, the armatures 66 and 66' provided with the coils 64 and 64' are brought together, facing one another. Ferromagnetic bars 65 are inserted into each of the housings 661, 662 and 663 of the armature 66. The armature 66 is then secured to the armature 66' by inserting the opposite end of each of the ferromagnetic bars 65 into the corresponding housings 661, 662 and 663 of the armature 66. The fastening elements 664 and 665 are then inserted into one other, and then secured by snap-fastening so as to interlock these armatures 66 and 66'.

The measuring device 60 is then ready to be mounted on the electronic board 50.

FIG. 12 illustrates another embodiment of the measuring device 60. The current measuring device of this embodiment is noted as "600". This measuring device 600 is particularly adapted for a variant of the link module 30, wherein and electrical conductors 31, 32 and 33 are replaced by electrical power conductors 310, 320 and 330 which are superimposed on each other.

The elements of this measuring device 600, which are similar to the measuring device 60, bear the same references but with an additional zero symbol. For example, the measuring device 600 comprises ferromagnetic bars bearing the reference 650 and which are similar to the ferromagnetic bars 65 of the measuring device 60. These elements are thus not described in detail, insofar as the description above can be applied to them. Here, there are two bars 650.

The measuring device 600 differs from the measuring device 60 particularly in that the armatures 660 and 660' each comprise a main rectilinear part and secondary branched parts that project from the main part perpendicularly to the main part.

In this example, the armatures 660 and 660' each comprise three secondary parts that extend from the same side of the main part so that these armatures have an E-shape. The coils 84 are thus arranged on the secondary parts projecting from the armature 660. The coils 640' are arranged on the secondary parts projecting from the armature 660'.

Each main part of the armatures 660 and 660' comprises a recess extending over the entire length of the main part and into which a ferromagnetic bar 650 is received.

Owing to this provision, the armatures 660 and 660' can be assembled together about the electrical conductors 310, 320 and 330.

FIGS. 13 and 14 show the voltage sensor 80 in greater detail.

The voltage sensor 80 aims to detect a differential in electric potential between two of the electrical conductors 31, 32 and 33, here between the electrical conductors 31 and 33. This indirectly helps the state of the circuit breaker 10 to be known and to notably know if this circuit breaker is open or closed. The electronic unit 51 is further configured to generate a signal representative of the state of circuit breaker 10 by means of the data supplied from the voltage sensor 80.

The voltage sensor comprises at least one electrically conductive plate, or electric field sensor, placed at a distance and facing one of the plates 316, 326 or 336 of the electrical conductors 31, 32 and 33, respectively. The presence or, alternatively, the absence of an electrical voltage is determined indirectly based on the electrical capacitance value between these plates by means of a dedicated measuring circuit 84.

More precisely, the detector 80 comprises two such plates 81 and 83 here, made of a conductive material and extending parallel to the geometric plane P. In an assembled configuration of the module 30, the plate 81 faces the plate 316 while being aligned with said plate 316. Similarly, the plate 83 faces the plate 336 while being aligned with this plate 336. These plates 81 and 83 are formed on the face 502 of the electronic board 50, for example by a deposit of a metallic path made of copper. The dimensions of the plates 81 and 83 are identical dimensions to the plates 316 and 336, respectively, to within 5% or preferably to within 1%. Here, the plates 81 and 83 have identical surface areas between them. The plates 81 and 316 are separated from each other by the overmoulded part 41 and are in contact with the overmoulded part 41. The same is true with the plates 83 and 336, respectively.

The distance between the plates 81 and 316, noted as "d", is measured along a direction perpendicular to the geometric plane P. This distance d is equal to the thickness of the overmoulded part 41 which covers an upper face of the plate 316. The distance d is chosen so as to bring the plate 81 as close to the plate 316 as possible, without compromising the electrical isolation function of the power conductor 31 provided by the overmoulded part 41. The distance d is preferably less than or equal to 2 mm, preferably between 0.5 mm and 1 mm and, even more preferably between 0.65 mm and 0.85 mm. To illustrate this, here the distance d is equal to 0.8 mm. The plates 83 and 336 are also separated from one other by the distance d.

The capacitor, formed by the plates 81 and 316 is noted C1, and the capacitor formed by the plates 83 and 336 is noted C2. Here, the respective electrical capacitances of the capacitors C1 and C2 are equal, given the dimensions and the relative arrangements of the plates 81, 83, 316 and 336.

The capacitance value of the capacitor C1 is equal to $(\varepsilon \times S)/d$, where S is the surface area of the plates 81 and 316 facing each other and "$\varepsilon$" is the electrical permittivity of the material forming the overmoulded part 41. Here, the surface area S is equal to the product of the length L multiplied by the width l, insofar as the plates 81 and 316 are identical and facing one another. Here, given the numerical values indicated previously, the surface area S is equal to 74 $mm^2$. In the case of the polyamide 6-6, the capacitor C1 has a capacitance between 2.8 pF and 4.4 pF when the distance d is between 0.65 mm and 0.85 mm. A person skilled in the art knows that the capacitance of the capacitor C1 is inversely proportional to the distance d.

The sensor 80 also comprises a measuring circuit 84, which includes the plates 81 and 83 and a measuring resistor 801 whose ends are connected to the plate 81 at one end and to the plate 83 at the other end. The measuring circuit 84 is adapted to acquire a measuring voltage Vm at the terminals of the measuring resistor 801.

The measuring circuit 84 advantageously comprises a bidirectional Zener diode 802, that protects the measuring circuit 84 from overvoltages, notably likely to occur when the electrical system 1 or its electrical power supply source is struck by lightning.

The measuring circuit 83 is connected to an input of the electronic unit 51 by means of an analogue-digital converter, not shown. Advantageously, the measuring circuit 83 also comprises a low-pass filter 803 configured to allow frequencies in the 45 Hz-65 Hz range to pass.

The filter 803 prevents saturation of the analogue-digital converter input, which may cause the sensor 80 to malfunction. Such a filter 803 notably allows the harmonics of the electric power supply current to be filtered, which could disturb the measurement of the circuit 83. Here, the electric power supply current of the assembly 3 has a frequency of 50 Hz or 60 Hz.

Finally, the sensor 80 comprises a ground plane 82, arranged on the face 502 and connected to an electrical ground GND of the measuring circuit 84, so as to protect the device 80 from electromagnetic disturbances. This ground plane 82 is formed by depositing a metallic layer on the face 502, over a surface area positioned opposite the surface area occupied by the current sensor 61.

In this example, the presence of an electrical voltage is detected by the voltage sensor 80 between the electrical conductors 31 and 33. When an electrical voltage Vp is present between these electrical conductors 31 and 33, the measuring voltage Vm at the terminals of the resistor 501 is equal to a value that depends on the voltage Vp and the capacitance of the capacitors C1 and C2. For example, the voltage Vm is calculated with the following formula:

$$Vm = \frac{Vp \times (Rm + Zm)}{Zm + C}$$

where "Rm" is the value of the measuring resistance 801, "Zm" is the measuring impedance of the electronic unit 51 and "C" is the capacitance value of the capacitors C1 and C2.

By way of illustration, for a voltage Vp equal to 380 V with a frequency of 50 Hz, the voltage Vm is equal to 150 mV.

According to another example, for a voltage Vp equal to 190 V with a frequency of 60 Hz, the voltage Vm is equal to 62 mV.

On the other hand, in the absence of an electrical voltage between the electrical conductors 31 and 33, the measuring voltage is null.

The unit 51 is programmed to measure the measuring voltage supplied by the measuring circuit 84, for example continuously or repetitively over time, and to generate a corresponding status signal depending on the measuring voltage Vm acquired. The unit 51 then sends this status signal to the data bus, at a predetermined time, for example, or in response to a request issued by the central unit 2.

For example, the electronic unit 51 automatically determines that there is no voltage between the electrical conductors 31 and 33 if the measured voltage Vm remains at zero in a sustainable manner, for example for more than ten times the duration of the frequency of the electric power supply current, preferably more than one hundred times. Otherwise, the electronic unit 51 determines that an electrical voltage is present between the electrical conductors 31 and 33.

Such a voltage sensor 80 can detect the presence or, alternatively, the absence of an electrical voltage and thus extrapolate the status of the circuit breaker 10 of the assembly 3 to which the module 30 belongs, without the need to physically access the circuit breaker 10. This detection is achieved without direct electrical contact with the electrical conductors 31, 32 and 33. It is therefore not necessary to provide the voltage sensor 80 with galvanic isolation, which is more expensive and more complicated to integrate. The accuracy of the measurement is not an obstacle to proper operation of the voltage sensor 80, because we primarily want to know whether or not an electrical voltage Vp is present between the power conductors 31 and 33, and not necessarily obtain an accurate value of this electrical voltage.

Alternatively, the voltage sensor 80 can be made differently, for example by substituting the plates 81 and 83 by a single electrical field sensor arranged opposite one of the central parts 311, 321 or 331.

According to another variant, the voltage sensor 80 is replaced by a voltage sensor comprising a voltage divider connected directly to the electrical conductors 31, 32 and 33. In this case, galvanic isolation is necessary.

FIGS. 15 and 16 represent the data link 90 between the module 30 and the contactor 20. This data link 90 is adapted to transmit an opening or closing control signal of the contactor 20. This data link 90 is also adapted to collect one or more measuring signals of the status of the contactor 20. This device 90 is adapted to connect to a corresponding input/output signal interface of the contactor 20.

More precisely, the link 90 comprises a connector 91 and pairs of wires 92, 93 and 94. The connector 91 is adapted to be connected to the electronic board 50. Here, for example, the connector 91 is secured to the board 50, at one end of the electronic board 50.

Advantageously, the link 90 comprises a rigid armature on which the pairs of wires 92, 93 and 94 are mounted. For example, this armature is made of plastic overmoulded onto the pairs of wires 92, 93 and 94. This facilitates the assembly of the module 30 on the contactor 20, notably by reducing the space occupied by the wires 92, 93 and 94. This armature can be omitted.

The connector 91 comprises several openings, each intended to receive one of the pairs of wires 92, 93 or 94, so as to connect them electrically to the corresponding electrical paths of the printed circuit of the electronic board 50.

For example, the wires of the pair of wires 92 are intended to electrically power the actuator of the contactor 20. The pair of wires 93 is configured to collect the NO status signal from a corresponding output interface of the contactor 20. Similarly, the wires of the pair of wires 94 are adapted to collect the NC status signal from the corresponding output interface of the contactor 20.

In this example, as shown in FIG. 11, one of the terminals associated with the wire 92 is common with one of the terminals associated with the wire 93. This is, for example, due to the fact that the corresponding signals are generated with respect to a common electrical ground within the electrical contact 20. Alternatively, these two wires may be separate from each other.

FIG. 12 shows another embodiment of the link 90. This data link, noted 90', is similar to the link 90, but differs in that this pair of wires 94 is omitted. This is useful in applications for which knowledge of the NC signal status is not required.

Owing to the measuring device 60, the voltage sensor 80 and the electronic unit 51, the module 30 is able to collect real-time information about the operating status of the circuit breaker 10 and the contactor 20, and to better control them, based on this information and/or from the central unit 2.

Owing to this module 30, the electrical assembly 3 has advanced communications and monitoring functions, without having to modify the architecture or the operation of the circuit breaker 10 or the contactor 20. The module 30 thus allows new features to be added to existing product ranges, even to circuit breakers 10 and/or contactors 20 already installed on an existing electrical installation 1.

The embodiments and variants discussed above can be combined to generate new embodiments.

The invention claimed is:

1. A measuring device for measuring electric currents in an electrical circuit, said measuring device comprising:
   multiple Rogowski current sensors, each adapted to measure an electric current in an electrical conductor, said current sensors being adjacent in pairs and each having:
   coils adapted to be electrically connected together to form a current measuring circuit,
   a central opening for receiving the corresponding electrical conductor, and the coils being arranged on the periphery of the central opening;
   a plurality of ferromagnetic bars; and
   a first armature and a second armature arranged parallel to each other,
   wherein each current sensor comprises two of said coils arranged in parallel and face to face on opposite edges of the central opening and two of said ferromagnetic bars extending between the ends of the coils, perpendicularly to a longitudinal axis of the coils,
   wherein the first and second armatures extend along the longitudinal axis of the coils and the first and second armatures both comprise housings that are each adapted to receive one end of one of the ferromagnetic bars, and
   the first and second armatures are secured together by fasteners, the fasteners being included in some of the housings, but not all of the housings, and holding the ferromagnetic bars in position.

2. The measuring device according to claim 1, wherein each current sensor has a ferromagnetic bar in common with the immediately adjacent current sensor.

3. The measuring device according to claim 1, wherein the first and second armatures are common to all the current sensors of the device, the two coils of each current sensor being arranged on the first and second armatures, respectively.

4. The measuring device according to claim 3, wherein each of the first and second armatures have a rectilinear part, and coils being arranged on these first and second armatures by winding about this rectilinear part.

5. The measuring device according to claim 4, wherein the first and second armatures are identical.

6. The measuring device according to claim 3, wherein the first and second armatures each comprise a main part of rectilinear shape and secondary parts which protrude from the main part perpendicularly to the main part, and coils being formed by winding on the first and second armatures at the secondary parts.

7. The measuring device according to claim 1, wherein the ferromagnetic bars are made of an iron alloy, including soft iron or NiFe or FeSi.

8. An assembly comprising:
   an electrical device, electrically powered by electrical conductors; and
   a measuring device, adapted to measure electric current flowing through each of the electrical conductors,
   wherein the measuring device includes
   multiple Rogowski current sensors, each adapted to measure the electric current in an electrical conductor of the electric conductors, said current sensors being adjacent in pairs and each having:
   coils adapted to be electrically connected together to form a current measuring circuit,
   a central opening for receiving the corresponding electrical conductor, and the coils being arranged on the periphery of the central opening,
   a plurality of ferromagnetic bars, and
   a first armature and a second armature arranged parallel to each other,
   wherein each current sensor comprises two of said coils arranged in parallel and face to face on opposite edges of the central opening and two of said ferromagnetic bars extending between the ends of the coils, perpendicularly to a longitudinal axis of the coils,
   wherein the first and second armatures extend along the longitudinal axis of the coils and the first and second armatures both comprise housings that are each adapted to receive one end of one of the ferromagnetic bars, and
   the first and second armatures are secured together by fasteners, the fasteners being included in some of the housings, but not all of the housings, and holding the ferromagnetic bars in position.

9. The measuring device according to claim 1, wherein the housings include four housings, two of the housings include the fasteners that secure the first and second armatures together and hold the ferromagnetic bars in position, and two of the housings do not include the fasteners.

10. The measuring device according to claim 1, wherein the four housings are spaced apart by spacings therebetween.

11. The measuring device according to claim 1, wherein the fasteners are connectable elements of complimentary shape.

12. The measuring device according to claim 1, wherein the first and second armatures include connection pins, the connections pins being positioned on distal ends of the housings.

13. The measuring device according to claim 12, wherein each of the connection pins is in a form of a straight rod made of an electrically conductive material, one end of which is configured to be received inside an electronic board.

14. The measuring device according to claim 13, wherein the first and second armatures include fastening studs projecting from the measuring device and configured to be received by corresponding holes of the electronic board, the fastening studs being different from the connection pins.

* * * * *